US005706226A

United States Patent [19]
Chan et al.

[11] Patent Number: 5,706,226
[45] Date of Patent: Jan. 6, 1998

[54] LOW VOLTAGE CMOS SRAM

[75] Inventors: Tsiu Chiu Chan, Carrollton; Herman Ma, Dallas, both of Tex.

[73] Assignee: SGS-Thomson Microelectronics, Inc., Carrollton, Tex.

[21] Appl. No.: 777,778

[22] Filed: Dec. 31, 1996

[51] Int. Cl.$^6$ .................................................. G11C 11/00
[52] U.S. Cl. .......................... 365/156; 365/154; 257/903; 257/274
[58] Field of Search ............................... 365/156, 154, 365/190; 257/903, 274

[56] References Cited

U.S. PATENT DOCUMENTS

| 5,523,966 | 6/1996 | Idei et al. | 365/156 |
| 5,526,303 | 6/1996 | Okajima | 257/903 X |
| 5,623,440 | 4/1997 | Saito | 365/156 X |

OTHER PUBLICATIONS

Sung–Mo Kang and Yusuf Leblebici, "CMOS Digital Integrated Circuits; Analysis & Design", McGraw–Hill, 1995, Chapter 2.

*Primary Examiner*—David C. Nelms
*Assistant Examiner*—Huan Hoang
*Attorney, Agent, or Firm*—Richard A. Bachand; Theodore E. Galanthay; Lisa K. Jorgenson

[57] ABSTRACT

A complementary-metal-oxide-semiconductor, static-random-access-memory cell has two pairs of n-channel and p-channel transistors in complementary symmetry, push-pull arrangement. One pair of complementary transistors stores the binary state of the memory cell, and the other pair of complementary transistors stores the complement of the binary state of the memory cell. Both transistors in each of the complementary pairs of complementary transistors in the memory cell have nearly equal current carrying capacity and provide a voltage trip point for a change of state of the memory cell equal to approximately 1/2 the bias voltage across the memory cell. Complementary word lines and bit lines select a memory cell for reading or writing. The wordline control gates have complementary transistors, and those complementary transistors push or pull current to the memory cell in parallel to minimize the effect of transistor threshold voltage on the flow of current to the complementary transistors in the memory cell. A pair of transmission gates are connected one each to each of the complementary bit lines. Each transmission gate has a pair of complementary transistors and an actuation input. The transmission gates upon actuation passing voltages on complementary bit-lines indicative of the state of the memory cell.

16 Claims, 2 Drawing Sheets

LOW VOLTAGE CMOS SRAM

BACKGROUND OF THE INVENTION

1. Field of the Invention

The present invention relates to complementary-metal-oxide-semiconductor (CMOS) static random access memory (SRAM) and more particularly relates to CMOS SRAM which is designed specifically for low voltage use.

2. Description of the Related Art

Read-write (R/W) memory circuits are designed to permit the modification (writing) of data bits to be stored in the memory array as well as their retrieval (reading) on demand. The memory circuit is said to be static when the stored data can be retained indefinitely (as long as a sufficient power supply voltage is provided), without any need for a periodic refresh operation.

The data storage cell, for example a 1-bit memory cell in a static RAM array is conventionally comprised of a simple latch circuit with two stable operating points. Depending on the preserved state of the two-inverter latch circuit, the data being held in the memory cell may be interpreted either as a logic "0" or as a logic "1." To read and/or write the data contained in the memory cell via the bit line, at least one switch, which is controlled by a word line, i.e., the row address selection signal is required. Normally, two complementary access switches comprising nMOS (or pMOS) pass transistors are implemented to connect the 1-bit SRAM cell to the complementary bit lines (columns).

Where cell size is important, and power requirements are not so significant, resistive-load inverters with undoped polysilicon resistors in the latch structure typically results in a significantly more compact cell size. This is true since the resistors can be stacked on top of the cell (using double-polysilicon technology), thereby reducing the cell size to four transistors, as opposed to more conventional six-transistor cell topologies. If multiple polysilicon layers are available, one layer may be employed for the gates of the enhancement type nMOS transistors, while another level is used for load resistors and interconnect ions.

A low-power SRAM cell may be implemented simply by employing cross-coupled CMOS inverters instead of resistive-load nMOS inverters. In this example, the standby power consumption of the memory cell is limited to the relatively small leakage currents of both CMOS inverters. On the other hand, the cell area tends to increase in order to accommodate the n-well for the pMOS transistors and the polysilicon contacts.

The circuit structure of a prior art CMOS static RAM cell 10 is shown in FIG. 1 and includes nMOS transistors 11, 12 and complementary pMOS transistors 13, 14, along with the pMOS column pull-up transistors 16, 18 on the complementary bit lines 15, 17 respectively. The word line nMOS transistors 21 and 22 have their gates connected to the word line 20. The basic operating principle of the CMOS SRAM cell is identical to that of the resistive load nMOS cell. The most important advantage of this circuit topology is that static power dissipation is smaller being limited by the leakage current of the pMOS transistors. A CMOS memory cell 10 thus draws current from the power supply Vdd only during a switching transition. The low standby power consumption is the principal reason for the increasing prominence of high density CMOS SRAMs. The pMOS column (bit-line) pull-up transistors 16, 18 shown in FIG. 1 allow the column or bit-line voltages Vc to reach full Vdd or power supply voltage level. To further reduce power consumption, the pMOS column pull-up transistors can also be driven by a periodic precharge signals, which activate the pull up devices to charge-up column capacitances Ccc.

To determine the width-to-length (W/L) ratios of the transistors in a typical CMOS SRAM cell as shown in FIG. 1, a number of design criteria must be taken into consideration The two basic requirements which dictate the (W/L) ratios are: (a) the data-read Operation should not destroy the stored information in the SRAM cell, and (b) the cell should allow modification of the stored information during the data-write phase.

Consider a data-read operation first, assuming that a logic "0" is stored in the cell. The voltage levels in the CMOS SRAM cell at the beginning of the "read" operation are as follows: the transistors 12 and 13 are turned off, while the transistors 11 and 14 operate in the linear mode. Thus, the internal node voltages at nodes "A" and "B", before the cell word line access (or pass) transistors 21 and 22 are turned on, are: at A=0 and at B=the supply voltage, or $VDD$.

After the pass transistors 21 and 22 are turned on by row selection circuitry, the voltage level of bit lines 15 and 17 will not show any significant variation since no current will flow through transistor 22. On the other half of the cell, however, transistors 11 and 21 will conduct a non zero current and the voltage level Vc of bit line 15 will begin to drop slightly. Note that the column capacitance (denoted symbolically by Cc) is typically very large; therefore, the amount of decrease in the bit-line voltage is limited to a few hundred millivolts during the read phase. The data-read circuitry, which although not part of the present invention, is responsible for detecting this small voltage drop and amplifying it as a stored "0." While transistors 21 and 11 are slowly discharging the column capacitance of bit line 15, the voltage at node "A" will increase from its initial value of 0 V. If the (W/L) ratio of the access transistor 21 is large compared to the (W/L) ratio of transistor 11, the node voltage at "A" may exceed the threshold voltage of transistor 12 during this process, forcing an unintended change of the stored state. The key design issue for the data-read operation is then to guarantee that the voltage at node "A" does not exceed the threshold voltage of transistor 12, so that the transistor remains turned off during the read Phase.

It can be assumed that after the access transistors 21 and 22 are turned on, the column (bit-line) voltage Vc remains approximately equal to VDD. Therefore, transistor 21 operates in saturation while transistor 11 operates in the linear region.

The upper limit of the aspect ratio (W/L of transistor 21 to the W/L of transistor 11) can be conservative since a portion of the drain current of 21 will also be used to charge-up the parasitic node capacitance of node "A". To summarize, transistor 12 will remain in cut-off during the read "0" operation. A symmetrical condition also dictates the aspect ratios of transistors 12 and 22.

Now consider the write "0" operation, assuming that a logic "1" is stored in the SRAM cell initially. The transistors 11 and 14 are turned off, while the transistors 12 and 13 operate in the linear mode. Thus, the internal node voltages are "A"=VDD and "B"=0 volts before the cell access (or pass) transistors 21 and 22 are turned on.

The column voltage Vc is forced to logic "0" level by the data-write circuitry; thus, it may be assumed that Vc is approximately equal to 0 volts. Once the pass transistors 21 and 22 are turned on by the row selection circuitry, the node voltage at "B" remains below the threshold voltage of transistor 11, and since transistors 12 and 22 are designed according to the forgoing, (i.e., the upper limit of the aspect ratio, W/L of transistor 22 to the W/L of transistor 12, is a conservative value) the voltage level at node "B" is insufficient to turn on transistor 11. To change the stored information, i.e., to force node "A" to 0 volts and node "B" to VDD, the node voltage "A" must be reduced below the threshold voltage of transistor 12, so that transistor 12 turns off first. When the node voltage at node "A" reaches a predetermined design level, the transistor 21 operates in the linear region while transistor 13 operates in saturation.

In summary, transistor 12 will be forced into the cut-off mode during the write "0" operation if the relationship of the Width/Lengths (W/L) ratios of transistors 22 to 12 is satisfied. This will guarantee that transistor 11 subsequently turns on, changing the stored information.

In the cell and associated structures described above relative to FIG. 1, the ratio ($\beta$) of current carrying capacity, or impedance, of n- and p-transistors is approximately 3:1. In these devices, the lengths of both the p-channel and n-channel transistors is about 0.5 microns, while the width of the p-channel transistor is about 0.5 microns and the width of the n-channel device is about 0.8 microns. While this is acceptable in a device operating at 3 volts, it is not reliably acceptable in a device operating at or less than 1 volt. That such a low operating voltage for SRAM is preferable, is easily understood when examining the desirable size and power requirements in such well known products as pagers, setup RAM for small computers including hand-held computers etc.

SUMMARY OF THE INVENTION

In view of the above, it is a principal object of the present invention to provide a CMOS memory cell design which permits of reliable operation at approximately or less than 1 volt.

This object has been accomplished by constructing a complementary-metal-oxide-semiconductor, random-access-memory with two pairs of n-channel and p-channel transistors in complementary symmetry, push-pull arrangement. One pair of complementary transistors stores the binary state of the memory cell, and the other pair of complementary transistors stores the complement of the binary state of the memory cell. Both transistors in each of the complementary pairs of complementary transistors in the memory cell have nearly equal current carrying capacity and provide a voltage trip point for a change of state of the memory cell equal to approximately ½ the bias voltage across the memory cell.

A plurality of memory cells arranged in logical rows and columns create a memory matrix of memory cells. Complementary word lines and bit lines select a memory cell for reading or writing. A pair of wordline control gates are provided and each control gate is connected to both of the complementary wordlines. Each of the wordline control gates has complementary transistors, and each of those complementary transistors have a gate connected to a different one of the complementary word lines. Each of the wordline control gates, when selected by the complementary wordlines push or pull current to or from the appropriate pair of complementary transistors in the memory cell. Each complementary pair of transistors in each wordline control gate push or pull current to the memory cell in parallel to minimize the effect of transistor threshold voltage on the flow of current to the complementary transistors in the memory cell.

Complementary bit-lines operate with the complementary wordlines for selecting the memory cell. The complementary bit-lines are connected respectively to each of the wordline control gates, and voltages on the complementary bit-lines pass between the bit lines and the memory cell through the wordline gates when the wordline gates are selected by signals on the complementary wordlines.

A pair of transmission gates are also connected one each to each of the complementary bit lines. Each transmission gate has a pair of complementary transistors and an actuation input. The transmission gates upon actuation passing voltages on complementary bit-lines indicative of the state of the memory cell.

As a further feature of the invention, the complementary transistors in each transmission gate have substantially the same current carrying capacity whereby the rise times and fall times of signals through the transmission gates is substantially the same.

As another feature of the invention all transistors are provided with a source of forward bias for the back-gates of the transistors to enhance write and read speed by lowering the voltage required at the transition gates for turning on/off the transistors.

Other objects, features, advantages and a more complete understanding of the invention may be had by referring to the following description taken in conjunction with the accompanying drawings.

DESCRIPTION OF THE ILLUSTRATIVE EMBODIMENT

Figure 2:
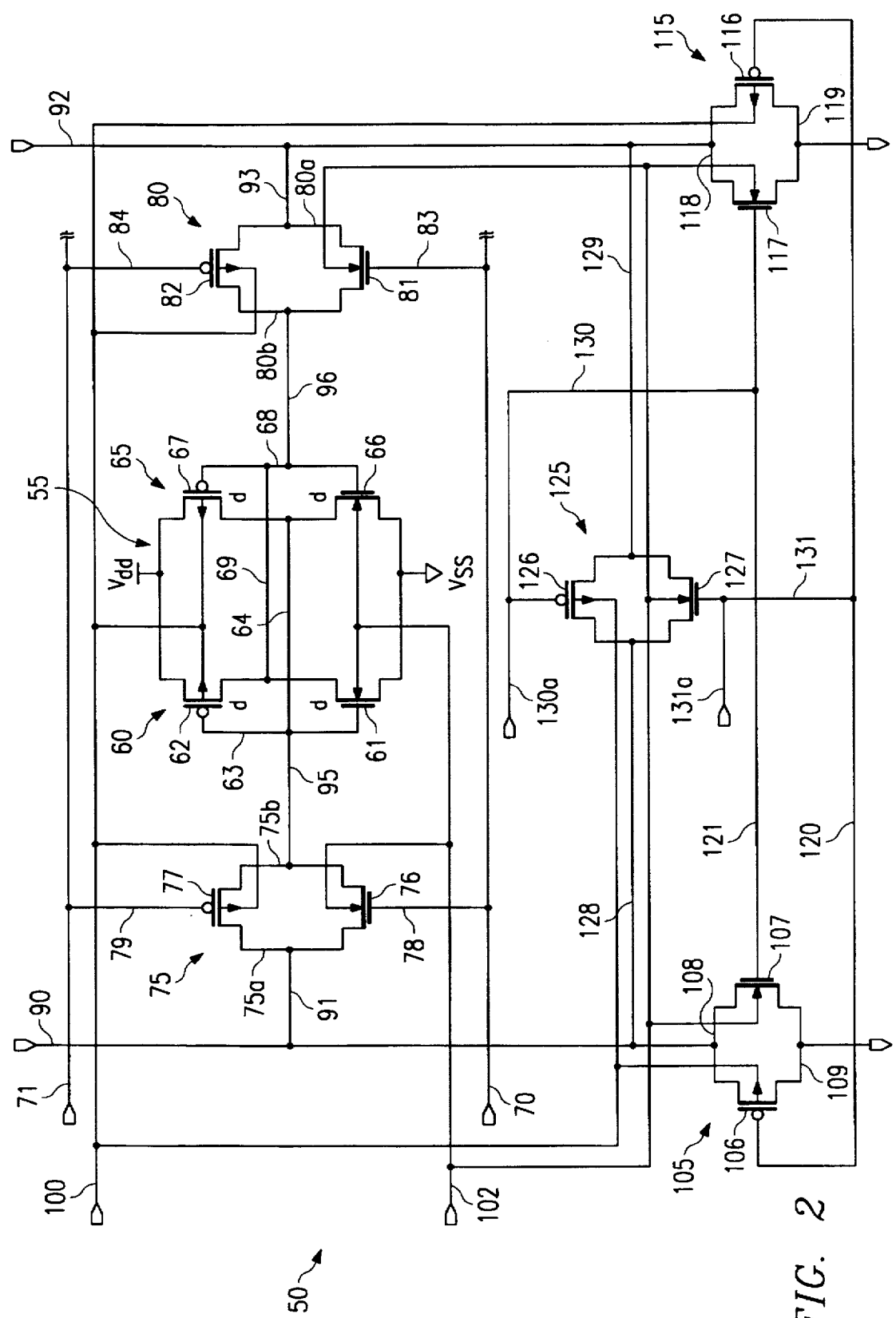
FIG. 2 is a schematic diagram of a CMOS SRAM cell constructed in accordance with the present invention.

Turning now to the drawings, and especially FIG. 2 thereof, a schematic diagram of a complementary-metal-oxide-semiconductor, static-random-access-memory (CMOS SRAM 50), constructed in accordance with a preferred embodiment of the present invention, is shown therein. The CMOS SRAM 50 includes a memory cell portion 55. The memory cell portion 55 comprises at least two pairs, 60, 65 of n-channel and p-channel transistors, 61, 62 and 66, 67 arranged in a complementary symmetry, push-pull arrangement. The complementary pair 60 of n-channel, p-channel transistors 61, 62 respectively, are connected drain to drain (the drains are designated with a small letter "d" in FIG. 2) and the other complementary pair 65 of n-channel, p-channel transistors 66, 67 respectively being connected drain to drain with the gates of each pair being interconnected gate to gate as by interconnections 63 and 68 respectively. To complete the structure of the memory cell portion 55, the gates of one complementary transistor pair 65 are connected to the interconnected drains of the other complementary transistor pair 60 as by the interconnection 69, and the gates of the other complementary transistor pair 60 are connected as by the interconnection 64 to the interconnected drains of the opposite complementary transistor pair 65.

The memory cell portion stores a binary state by the gates of one transistor pair and the drains of the other pair being at a high voltage and the gates of the other pair and the drains of the one pair being at a low voltage. The opposite binary state is stored by reversing the voltages.

In accordance with a feature of the present invention, in the processing or manufacture of at least the memory cell portion 55, the complementary transistors 61, 62, and 66,67 have a ratio (β) of current carrying capacity (or impedance) equal to one or very near to one (1:1). With transistor 61 and transistor 62, and likewise transistor 66 and transistor 67, having substantially the same current carrying capacity the trip point for switching storage states in the memory cell will be ½ Vdd or half the voltage bias across the memory cell. As the current carrying capacities of the transistors move away from being equal, the trip point moves away from the midpoint of the bias voltage and higher bias voltages must be used.

With the manufacture or processing of a low voltage cell, depending upon doping levels and the like, the width to length (W/L) ratio of each device (n-MOS or p-MOS) will allow for the setting of a (β)=1. This in conjunction with triple well processing to facilitate back biasing of the gates, allows for ½ Vdd (supply voltage) trip points for the MOS transistors and for faster read and writes to and from the cell. As an example, and in the present instance, the cell lengths (both n and p transistors) are 0.5 microns and the cell widths, for p-transistors is 1.6 microns and for n transistors is 0.8 microns.

The following partial discussion of the well-established CMOS fabrication technology is provided to assist the description of the preferred embodiment of the present invention. CMOS fabrication technology requires that both n-channel (nMOS) and p-channel (pMOS) transistors be built on the same chip substrate such as the silicon substrate 40 illustrated in FIG. 3. To accommodate both nMOS and pMOS devices, special regions called wells (or sometimes tubs) must be created in which the semiconductor type is opposite to the substrate type. A p-well is created in an n-type substrate and an n-well is created in a p-type substrate. In the illustrated instance, n-wells 41 and 43 are formed in the p-silicon substrate 40, and a p-well 42 is formed in the n-well 43. In the n and p-well CMOS fabrication technology, the nMOS transistors are created in one or more p-type wells or in the substrate (since it is p type), and the pMOS transistors are created in the n-wells such as the n-wells 41 and 43 created in the p-type substrate 40.

In the CMOS fabrication technology, the process starts creation of the n-well regions for pMOS transistors, by impurity implantation in the substrate 40. Then, a thick oxide is grown in the regions surrounding the nMOS and pMOS active regions. A thin gate oxide is subsequently grown on the substrate by thermal oxidation. These steps are followed by the creation of n+ regions (source, drain, and channel-stop implants)and by final metallization of metal interconnects. A more complete understanding of the fabrication of MOSFETs may be found in chapter 2 of *CMOS DIGITAL INTEGRATED CIRCUITS; Analysis & Design* by Sung-Mo Kang and Yusuf Leblebici.

Turning once again to FIG. 2, complementary word lines 70, 71 are used for selecting a row of cells in the memory CMOS SRAM 50. In this connection, a pair of wordline control gates 75, 80, each of said gates comprising complementary nMOS and pMOS transistors 76, 77 and 81, 82 respectively, conduct current in parallel when turned on by the complementary wordlines.

As shown in the FIG. 2, each of the complementary transistors 76, 77, 81, 82 of each of the wordline control gates 75 and 80 has a gate connection connected to a respective one of said complementary word lines 70 or 71.

In the illustrated instance, the gates of nMOS transistors 76 and 81 are connected to wordline 70 via interconnections 78 and 83, while the gates of pMOS transistors 77, 82 are connected to the complement word line 71 by interconnections 79, 84. As may be seen, when wordline 70 is high, nMOS transistors 76 and 81 are biased on, while wordline 71 is low and likewise biases pMOS transistors 77 and 82 are biased on.

In order to permit reading or writing bits to and from the memory cell portion 55, complementary bit lines 90 and 92 are connected, respectively, to wordline control gates 75, 80 by way of interconnections 91 and 93. Bit line 90 is connected interconnection 75a of the complementary nMOS and pMOS transistors 76, 77, and bit line 92 is connected to interconnection 80a of complementary nMOS and pMOS transistors 81, 82. Inter-connection 75b of transistors 76, 77 is connected by interconnection 95 to interconnected gates 63 of transistors 61 and 62. Inter-connection 80b of transistors 81, 82 is connected by interconnection 96 to interconnected gates 68 of transistors 66 and 67.

As described above, the complementary transistors in the wordline control gates 75 and 80 conduct current in parallel and push or pull current into or out of the memory cell pair connected to the control gate. This ensures no current loss due to the threshold voltages of the transistors when operating at the low voltages (<1.0 volts). In essence these gates 75, 80 are transmissions gates with no threshold voltage losses.

Figure 1:
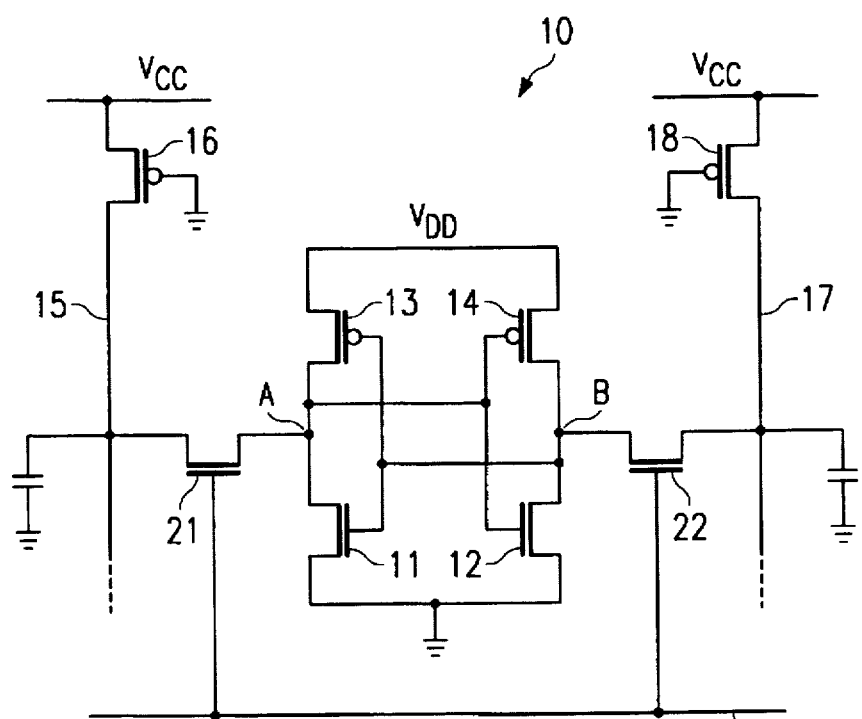
FIG. 1 is a schematic diagram of a prior art complementary-metal-oxide-semiconductor (CMOS), static-random-access-memory SRAM) cell.
Figure 3:
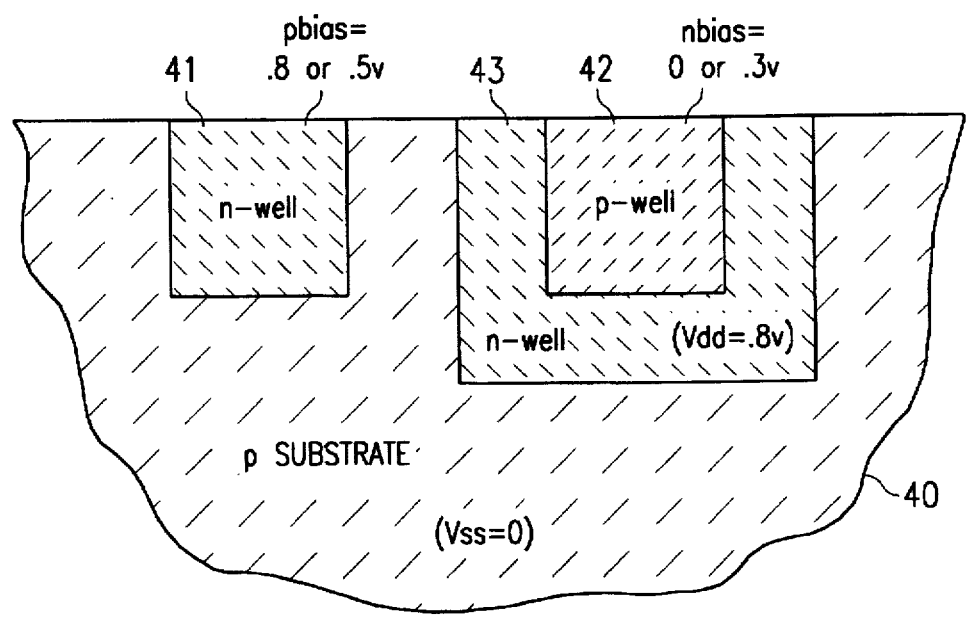
FIG. 3 is an enlarged, fragmentary side elevational view of a silicon wafer which has been processed for triple wells.

The following is an example of a write operation illustrating how the wordline control gates work. If Vss is 0 volts and Vdd is 0.8 volts, the trip point in changing binary states in the memory cell will be 0.4 volts. Assume the memory cell is selected by wordline 70 having a voltage of 0.8 volts and the complementary wordline 71 having a voltage of 0 volts. Further assume that the current state of the memory cell is that the voltage at interconnected gates 63 is 0 volts and the voltage at interconnected gates 68 is 0.8 volts. Finally, it is desired to write "1" to memory cell and 0.8 volts is on bit-line 90 and 0 volts is on bit-line 92. In wordline control gate 75 when the interconnected gate voltage on transistor pair 61 and 62 is switching from 0 volts to 0.8 volts, transistor 76 will conduct most of the current to transistor pair 61, 62 as the interconnected gate voltage rises to 0.4 volts. Thereafter, transistor 77 will conduct most of the current to transistor pair 61 and 62 as the interconnected gate voltage rises from 0.4 volts to 0.8 volts. Likewise in control gate 80 when the interconnected gate voltage on transistor pair 66 and 67 is switching from 0.8 volts to 0 volts, transistor 82 will conduct most of the current from transistor pair 66, 67 as the interconnected gate voltage drops from 0.8 volts to 0.4 volts. Thereafter, transistor 81 will conduct most of the current from transistor pair 66 and 67 as the interconnected gate voltage drops from 0.4 volts to 0 volts. Forward back gate, or well bias, is provided to all of the transistors to enhance turn-on, turn-off times and to increase the speed of read/write to the nMOS and pMOS transistors by lowering the thresholds for the transistors when selected. The transistor thresholds are lowered by the forward back gate bias typically from 0.6 to 0.4 volts. With a Vdd (supply voltage) of less than 1 volt, or −0.8 volts, back bias is provided for the pMOS transistors as shown schematically by line 100, and for the nMOS transistors as by line 102. As shown in FIG. 3, bias for the p channel transistors, i.e. n-wells is nominally 0.8 volts when the pMOS transistors are off and when in use 0.5 volts. The n bias line 102 provides the back bias for the nMOS transistors, i.e the p-wells 42, and is at 0 volts when the nMOS transistors are not selected and at 0.3 volts when they are selected.

In order that the status of the bit lines 90, 92 may be read to indicate the state of the memory cell portion 55, a pair of bit-line transmission gates 105, 115 are connected to the bit lines 90, 92. Each of the transmission gates 105, 115 comprise a pair of complementary transistors. Transmission gate 105 includes pMOS transistor 106 and nMOS transistor 107 connected in parallel at 108 and 109. Transmission gate 115 includes pMOS transistor 116 and nMOS transistor 117 connected in parallel at 118 and 119. As shown, the gates of pMOS transistors 106 and 116 are interconnected as by line 120, while interconnection 121 connects the gates of nMOS transistors 107 and 117. The complementary transistors in each of the transmission gates 105 and 115 have the same current carrying capacity in the preferred embodiment of the invention. In other words, transistor 105 has the same current capacity as transistor 107, and likewise transistor 116 has the same current capacity as transistor 117. Since the transistors in each transmission gate having a ($\beta$) ratio of current carrying capacity equal to one, the signal or voltage rise times will be substantially the same as the signal or voltage fall times in the transmission gates 105 and 115.

In order to properly read the bit-lines 90, 92 for proper reading of the memory cell portion 55, it is desirable to condition the bit-lines so that the memory cell may be read. This is especially true at the low voltages of the power supply Vdd. To this end, bit-line equalizer gate 125 brings the bit-lines to an equal voltage prior to allowing the memory cell portion 55 to charge the bit-lines. As illustrated, the bit-line equalizer gate includes a pair of complementary CMOS transistors 126 (pMOS) and 127 (nMOS) connected in parallel and also connected by interconnections 128, 129 to the complementary bit lines 90, 92, respectively. As shown, the gates of said bit-line equalizer complementary transistor pair 126, 127 are connected to the gates of the transistors of the bit-line transmission gates 105, 115 as by conductive lines 130 and 131 and also to preconditioning complementary signal inputs on lines 130a and 131a, respectively. It is noted that the energizing signal on line 131a to the gate of nMOS transistor 127 turns on this transistor while being applied to the gates of pMOS transistors 106 and 116, shutting those transistors off. The complement of this action occurs because of the energizing signal applied on line 130a to pMOS transistor 126 and nMOS transistors 107, 117. Thus bit-line equalizer gate 125 is turned on, shorting or equalizing the bit lines while turning off the bit-line transmission gates 105 and 115.

When the pre-conditioning signals are turned off from input lines 130a and 131a, and the word line is turned on, the matrix cell 55 charges the bit-lines 90 and 92 to whatever the state of the cell. Once again, for all of the reasons given heretofore, each transistor of the complementary pair of transistors in the bit-line equalizer gate 125 has a ratio of current carrying capacity or $\beta$ equal to one so that rise times and fall times through the equalizer are substantially the same.

When the word line 70 signal is raised or set to 0.8 volts and the complementary word line 71 is set to zero volts, n-channel transistors 76 and 81 are turned on and p-channel transistors 77, 82 are turned on. When writing a "1" into the cell, the bit-line 90 will be at 0.8 volts while the complementary bit line 92 will be set at zero volts. This will cause a "1" to be written into the memory cell portion or matrix 55 of cells 61, 62, 67, 66 Thus to write into the matrix of cells or memory cell portion 55, both word line and bit lines must be high, and the complements must be low or "0." To write a "0" into the memory cell portion 55, merely set word line 70 to 0.8 volts, and bit line 90 to zero volts and complement word line 71 to 0 volts and complement bit line 92 to 0.8 volts.

In this connection, when a 1 is stored in the memory cell, transistor 62 is turned off (0.8 volts at gate) and transistor 61 is turned on (0.8 volts at its gate). This means that the drains of transistors 62 and 61, which are connected, are at zero volts while the drains of transistors 67 and 66 are interconnected and at 0.8 volts.

Thus, by employing complementary MOS transistor types with a $\beta$ equal to one; employing back-gate bias on the transistors through the appropriate n-wells and p-wells, a low voltage memory scheme is achieved.

Although a preferred embodiment of the invention has been described with a certain degree of particularity, it should be recognized that elements thereof may be altered by person(s) skilled in the art without departing from the spirit and scope of the invention as hereinafter set forth in the following claims.

What is claimed is:

1. A complementary-metal-oxide-semiconductor, random-access-memory comprising:

a memory cell comprising at least two pairs of n-channel and p-channel transistors in complementary symmetry arrangement, each complementary pair of n-channel, p-channel transistors being interconnected drain to drain with the gates of each pair being interconnected gate to gate, the interconnected gates of one pair being connected to the interconnected drains of the other pair;

the transistors in each complementary pair of transistors having a ratio of current carrying capacity equal to one.

2. The memory of claim 1 further comprising:

a plurality of said memory cells arranged in logical rows and columns;

complementary word lines for selecting a row of said memory cells;

a pair of wordline control gates for a memory cell, each of said wordline control gates having a complementary transistors for pushing or pulling current to the memory cell in parallel to minimize the effect of transistor threshold voltage on the flow of current.

3. The memory of claim 2 further comprising:

each of said wordline control gates connected to the interconnected gates of different ones of the pairs of complementary transistors in the memory cell;

said complementary transistors of each of said wordline control gates having a gate connected to different ones of said complementary word lines.

4. The memory of claim 2 further comprising:

complementary bit lines for selecting a column of said memory cells;

each of said complementary bit-lines respectively connected at each memory cell through different ones of the complementary transistor pairs of said wordline control gates.

5. The memory of claim 4 further comprising:

a bit-line equalizer comprising a complementary pair of transistors and complementary actuation inputs for said complementary pair of transistors in said bit-line equalizer; and said bit-line equalizer resetting said complementary bit-lines upon the receipt of complementary signals on the complementary actuation inputs and upon removal of said complementary signals allowing the bit-lines to assume the memory state of the memory cell.

6. The memory of claim 5 wherein:

a ratio of current carrying capacity between the complementary transistors in said bit-line equalizer is approximately one so that signal rise times and fall times at said bit-line equalizer are substantially the same.

7. The memory of claim 4 further comprising:

a pair of transmission gates each comprising a pair of complementary transistors with the gates of like transistors in each transmission gate interconnected;

each of said transmission gates connected to a different one of said complementary bit lines, said transmission gates upon actuation passing a reading of the state of the memory cell.

8. The memory of claim 7 wherein a ratio of current carrying capacity between the complementary transistors in each transmission gate is approximately one so that signal rise times and fall times at said transmission gates are substantially the same.

9. A complementary-metal-oxide-semiconductor, random-access-memory cell comprising:

two pairs of n-channel and p-channel transistors in complementary symmetry, push-pull arrangement, one pair of complementary transistors storing the binary state of the memory cell and the other pair of complementary transistors storing the complement of the binary state of the memory cell;

both transistors in each of said complementary pairs of complementary transistors in said memory cell having nearly equal current carrying capacity and providing a voltage trip point for a change of state of the memory cell equal to approximately ½ the bias voltage across the memory cell.

10. The memory cell of claim 9 further comprising:

a source of forward bias for the back-gates of all transistors of said memory cell to enhance write and read speed by lowering the voltage required at the gates for turning on/off said transistors.

11. The memory cell of claim 9 further comprising:

complementary word lines for selecting the memory cell;

a pair of wordline control gates, each of said gates comprising complementary transistors, each of said complementary transistors of each of said wordline control gates having a gate connection connected to a respective one of said complementary word lines; and each of said wordline control gates when selected by said complementary wordlines pushing or pulling current to or from the appropriate pair of complementary transistors in the memory cell;

each complementary pair of transistors in each wordline control gate pushing or pulling current to the memory cell in parallel to minimize the effect of transistor threshold voltage on the flow of current to the complementary transistors in the memory cell.

12. The memory cell of claim 11 further comprising:

a source of forward bias for the back-gates of all transistors of said memory cell to enhance write and read speed by lowering the voltage required at the gates for turning on/off said transistors.

13. The memory cell of claim 11 further comprising:

complementary bit-lines operating with the complementary wordlines for selecting the memory cell;

said complementary bit-lines connected respectively to each of said wordline control gates, voltages on the complementary bit-lines pass between bit lines and the memory cell through the wordline gates when the wordline gates are actuated by signals on the complementary wordlines;

a pair of transmission gates each comprising a pair of complementary transistors, each of said transmission gates connected to a different one of said complementary bit lines, said transmission gates upon actuation passing voltages on complementary bit-lines indicative of the state of the memory cell.

14. The memory cell of claim 13 wherein the complementary transistors in each transmission gate have substantially the same current carrying capacity whereby the rise times and fall times of signals through the transmission gates is substantially the same.

15. The memory cell of claim 14 further comprising:

a source of forward bias for the back-gates of all transistors of said memory cell to enhance write and read speed by lowering the voltage required at the gates for turning on/off said transistors.

16. The memory cell of claim 13 further comprising:

a bit-line equalizer comprising a complementary pair of transistors and complementary actuation inputs for said complementary pair of transistors in said bit-line equalizer; and said bit-line equalizer resetting said complementary bit-lines upon the receipt of complementary signals on the complementary actuation inputs.

* * * * *